United States Patent [19]

King et al.

[11] 4,319,144
[45] Mar. 9, 1982

[54] SINGLE POLARITY CIRCUIT

[75] Inventors: William C. King, Chatham Township, Morris County; Dennis J. Lynes, Madison, both of N.J.; Charles E. Riehm, Jr., Melbourne Beach, Fla.; Sigurd G. Waaben, Princeton, N.J.

[73] Assignee: Bell Telephone Laboratories, Incorporated, Murray Hill, N.J.

[21] Appl. No.: 152,483

[22] Filed: May 22, 1980

[51] Int. Cl.³ .......................... H03K 5/22; H03K 3/42
[52] U.S. Cl. .................................. 307/236; 307/127; 307/262; 307/311; 363/127; 250/211 J
[58] Field of Search ............... 307/127, 138, 236, 262, 307/241, 243, 311; 361/77, 84, 245, 246; 179/18 AH, 86; 363/125-127

[56] References Cited

U.S. PATENT DOCUMENTS 3,626,201 12/1970 Chambers, Jr. ..................... 307/127
3,819,951 6/1974 Moore ................................. 307/262
3,823,271 7/1974 Carbrey .............................. 179/86
3,849,607 11/1974 Carbrey .............................. 179/86
3,860,868 1/1975 Lindell et al. ...................... 307/236
4,086,624 4/1978 Fraley ................................. 363/127

Primary Examiner—Stanley D. Miller, Jr.
Assistant Examiner—B. P. Davis
Attorney, Agent, or Firm—Lester H. Birnbaum

[57] ABSTRACT

A circuit with low impedance for maintaining a single polarity at an output is disclosed. Switching is provided by light controlled switching devices which in one embodiment are field effect transistors (14, 15, 16, 17) which are optically triggered by one or more photo-responsive devices (26', 27', 28', 29') coupled to their gate electrodes. The ON-OFF state of each switch is determined by the presence or absence of light from an adjacent line-powered LED (26, 27, 28, 29). A diode (32, 33, 34, 35) may be included in parallel with each switching device to provide surge protection.

8 Claims, 3 Drawing Figures

SINGLE POLARITY CIRCUIT

BACKGROUND OF THE INVENTION

This invention relates to circuits for maintaining a single polarity at their output in spite of polarity changes at their input, and in particular to such a circuit which possesses a low impedance.

In telephone systems, subscriber phones are energized by a source of DC potential from the central office. Frequently, the voltage polarity on the lines from the central office is reversed. Thus, some means are required to protect the station set and auxiliary circuitry from such polarity changes. A basic form of such a polarity guard circuit is a standard diode bridge which provides two current paths, one for each polarity, with each path including two forward-biased diodes. The voltage drop across the polarity guard circuit using p-n diodes is therefore typically approximately 1.4 volts. While such voltage drop is acceptable, it is desirable to keep the voltage drop as low as possible to permit a maximum loop length from central office to subscriber set. At the same time, it is also desirable to provide protection of the circuitry from current surges on the line.

In other types of electrical systems, it is desirable to provide an AC signal at the input and get a signal of a single polarity at the output. Such circuits are usually referred to as "full wave rectifiers" but operate in basically the same way as a polarity guard used with a DC signal, except that some sensing of the input polarity is usually provided. In any event, it is also desirable to provide as little voltage drop as possible across the circuits in order to conserve energy.

It is therefore a primary object of the invention to provide a polarity guard or rectifier circuit with a low ON state voltage drop. It is a further object of the invention to provide a polarity guard circuit which also includes surge protection for the devices of the circuit.

SUMMARY OF THE INVENTION

These and other objects are achieved in accordance with the invention. The circuit includes first and second inputs, first and second outputs, and means for producing the same polarity at the output regardless of the voltage polarity at the input. In accordance with one embodiment, said means includes a first pair of FETs with one transistor of the pair having its source and drain coupled between the first input and the first output and the other transistor having its source and drain coupled between the second output and the second input. The circuit also includes a second pair of FETs with one transistor of the pair having its source and drain coupled between the second input and the first output and the other transistor having its source and drain coupled between the second output and the first input. Each gate electrode of the FETs is coupled to at least one photo-responsive device. At least two light emitting devices are coupled to the input so at least one will emit light when a first polarity is applied and at least one other will emit light when the opposite polarity is applied. Each light emitting device is in close proximity to one or more photo-responsive devices of a corresponding pair of FETs so that one pair will be made conductive for the first polarity and the other pair will be made conductive for the opposite polarity. Surge protection can be provided by diodes coupled in parallel with each FET or by the particular structure of the FET itself.

BRIEF DESCRIPTION OF THE DRAWING

These and other features of the invention will be delineated in detail in the following description. In the drawing.

It will be understood that these figures are for illustrative purposes and are not drawn to scale.

DETAILED DESCRIPTION

Figure 1:
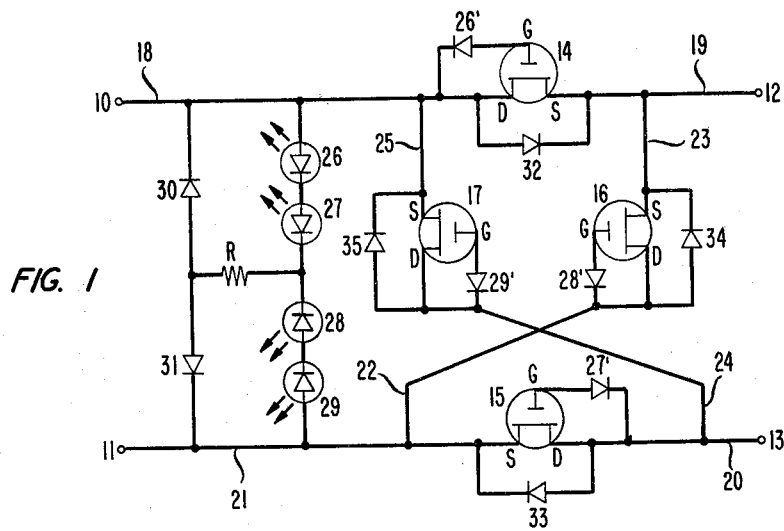
FIG. 1 is a circuit diagram of a circuit in accordance with one embodiment of the invention.

One embodiment of the invention is illustrated in the circuit diagram of FIG. 1. The circuit is shown with input terminals 10 and 11, and output terminals 12 and 13. In actual practice, the circuit would probably be interconnected with other circuitry and not contain identifiable terminals. Thus, the terminals are only representative of input and output portions of the circuit. Further, the circuit would be fabricated as an integrated circuit according to standard technology. Thus, the conductors to be described may not be distinct elements but may be part of a circuit chip as, for example, highly doped zones of semiconductor material. The term "conductor" is therefore meant to include an electrical connection by any suitable means including use of a semiconductor zone in common with several elements.

The circuit includes a first pair of field effect transistors, 14 and 15, and a second pair of field effect transistors, 16 and 17. The drain (D) of FET 14 was coupled to the input, 10, via conductor 18 and the source (S) was coupled to the output, 12, via conductor 19. The drain of FET 15 was coupled to the output, 13, by conductor 20, and the source was coupled to the input, 11, by conductor 21. The drain of FET 16 was coupled to input terminal 11 by conductors 21 and 22, and the source was coupled to the output terminal 12 by conductors 19 and 23. The drain of transistor 17 was coupled to output terminal 13 by conductors 20 and 24, and the source was coupled to input terminal 10 by conductors 18 and 25.

Coupled in series between input terminals 10 and 11 were light emitting devices (LEDs) 26, 27, 28 and 29. The LEDs were coupled so that 26 and 27 would emit light, (i.e., be forward biased) when terminal 10 was positive with respect to terminal 11 and 28 and 29 would emit light when terminal 11 was positive with respect to terminal 10. These LEDs may limit light in the visible or non-visible (infrared) portions of the spectrum. It should be realized that although four LEDs are shown in this embodiment, the circuit can operate with a minimum of two LEDs, one emitting light for each polarity. Also, if the LEDs have a sufficiently high reverse breakdown, they can be used as blocking diodes. Thus, for example, either LED 26 or 27 could be used in place of diode 31, and 28 or 29 could be used in place of diode 30. Resistor, R, was coupled to the cathodes of LEDs 27 and 28 to limit the current through the LEDs. For telephone applications, a resistance of 50 K ohms is useful. The resistor was coupled to terminals 10 and 11 through diodes 30 and 31, respectively. If desired, other means of current control could be used in place of the resistor.

Coupled between the gate (G) and drain (D) of FETs 14, 15, 16 and 17 are, respectively, photo-responsive devices 26', 27', 28' and 29'. These prime designations are used to indicate the fact that each photo-responsive device is in close physical proximity to a corresponding LED having the same numerical designation so that the photo-responsive device will be turned on when light is emitted by that LED. In this particular example, only one photodiode is shown coupled to the gate. It should be realized that this is symbolic, and in actual practice a plurality of photodiodes will usually be coupled in series to the gate to achieve the necessary potential to bias the gate above the threshold potential. (See, for example, U.S. Patent application of W. C. King, Ser. No. 889,261, filed Mar. 23, 1978, and assigned to the present assignee). Typically, a gate voltage of approximately 5 volts or more is desirable. In this example, the photoresponsive devices were monolithic III-V semiconductor photodiode arrays which generated approximately 5 volts.

Included in parallel with FETs 14, 15, 16, and 17 are, respectively, diodes 32, 33, 34 and 35 which have a forward voltage drop greater than that of the FETs at the normal operating current. The diodes are coupled with a polarity so as to forward bias diodes 32 and 33 when a positive potential appears at input 10 and forward bias diodes 34 and 35 when the polarity is reversed. These diodes can be separate structures or part of the structure of the particular FET itself.

Figure 2:
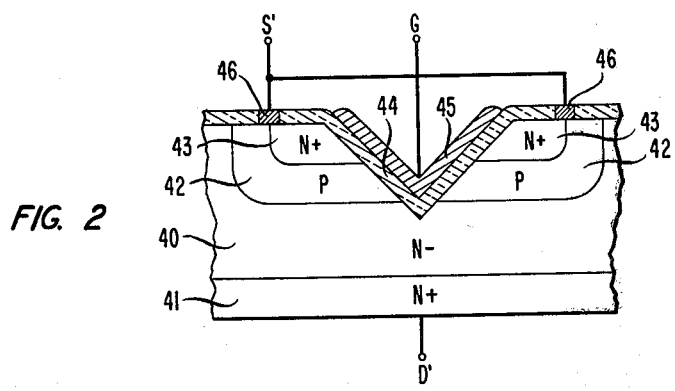
FIG. 2 is a cross-sectional, partly schematic view of a field effect transistor which may be utilized in accordance with the same embodiment.

An important feature of the invention is the fact that for the normal operating current the FETs possess a lower impedance than the diodes and therefore will produce a much lower voltage drop across the output terminals 12 and 13 than the prior art bridge. The particular FET utilized here was a commercially available n-channel VMOS device sold by Siliconix under the designation VN 98 AK. The basic structure is illustrated in FIG. 2. The N+ substrate constitutes the drain (D') as designated by the manufacturer. An N− epitaxial layer 40, is formed over the substrate, and surface regions of P-type and N+-type conductivity (42 and 43) are diffused therein. A v-groove is etched through these regions and into the epilayer. An oxide layer 44 is grown on the semiconductor surface and metal portions 45 and 46 are deposited to form the gate (G) and source (S') contacts. In operation, the device is normally off. A positive potential to the gate contact with respect to the source of sufficient magnitude forms channels for conduction in the p-region beneath the oxide 44 which thereby permits conduction between source and drain.

In the usual operating mode for an n-channel device, the terminal designated the source is at a negative potential with respect to the drain so that positive current runs from the substrate drain terminal to the surface source terminal. In this particular example, it was found advantageous, for reasons discussed below, to make the source terminal designated by the manufacturer positive with respect to the drain in the conducting mode so current ran in the reverse direction. However, in the blocking mode, the biases were conventional with respect to the manufacturer designated terminals. The source and drain terminals as shown in FIG. 2 are those designated by the manufacturer. However, in accordance with standard terminology, the term "source" as used in this application designates the source of majority carriers in the ON state conduction of the device (in this case, electrons). Consequently, the designations of source and drain in FIG. 1 are the reverse of those in FIG. 2. (i.e., the contact designated the drain by the manufacturer operates as the source of majority carriers and so is designated the source in FIG. 1).

Further, it will be realized that although an n-channel device is shown, a p-channel device could also be used with appropriate reversals of polarity in FIG. 1.

This particular type of FET device is attractive since it can be made with a very low impedance, i.e., less than approximately 1Ω if desired. Other types of FETs may also be used. For example, a standard junction field effect transistor (JFET) might be employed taking into account the fact that such a device is normally on and when a potential is applied to the gate the device will turn off. In general, any voltage controlled device can be used as a switching element provided it has a sufficient breakdown voltage to block the normal operating voltage and has a low forward voltage drop. The forward voltage drop should be less than 0.5 volts and is preferably less than 0.2 volts during normal operating current.

In the operation of the circuit shown in FIG. 1, it is first assumed that a positive potential appears at terminal 10 and a negative potential appears at terminal 11. This will forward bias LEDs 26 and 27 causing them to emit light. LEDs 28 and 29 will be reverse biased and so will not emit light. Light emission from 26 and 27 will respectively cause photo-responsive devices 26' and 27' to conduct and thereby apply a bias to the gates of FETs 14 and 15. This permits conduction from drain to source of both FETs and this current flows from terminal 10 through conductors 18 and 19, and from terminal 13 through conductors 20 and 21 to terminal 11. FETs 16 and 17 will remain nonconducting since no bias will be supplied to their gate electrodes. Thus, a positive potential will appear at terminal 12 and a negative potential at terminal 13.

Now it is assumed that the polarity is reversed so that a positive potential appears at 11 and a negative potential appears at 10. This will forward bias LEDs 28 and 29 causing emission of light therefrom while LEDs 26 and 27 will not emit since they are reverse biased. Photo-responsive devices 28' and 29' will therefore be made conductive, applying a bias, respectively, to the gates of FETs 16 and 17. This in turn will cause FETs 16 and 17 to conduct current between their source and drain, while FETs 14 and 15 will be nonconducting. Thus, current will be conducted from terminal 11 through conductors 21 and 22, FET 16, and conductors 23 and 19 to terminal 12. The return flow is from terminal 13 through conductors 20 and 24, FET 17, and conductors 25 and 18. Thus, the polarity at the output terminals will be preserved regardless of the polarity at the input, while only a small voltage drop will occur (in this example approximately 120 millivolts at 15 milliamps current). Preferably, the voltage drop should be less than 0.5 volts.

While the FETs possess a low impedance, their current-voltage characteristics are such that they are not usually suitable for withstanding high current surges which can often occur when the circuit is used as a polarity guard on the phone line. The diodes 32, 33, 34 and 35 provide this surge protection since standard diodes have a sharply vertical current voltage characteristic. In this particular example the diode was built into the VMOS structure of FIG. 2 (i.e., the P-region 42 and N-region 40). Any semiconductor diode which is capable of withstanding current surges may be employed.

Figure 3:
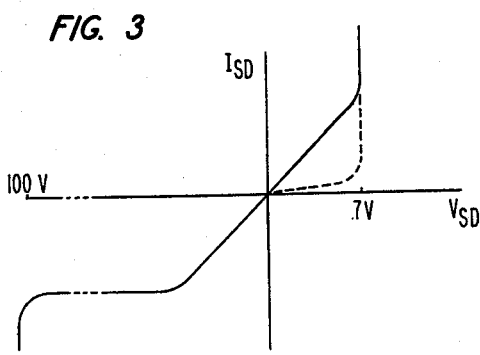
FIG. 3 is an approximate current-voltage characteristic for one portion of the circuit in accordance with the same embodiment.

The operation of the combination of FET and internal diode in parallel is illustrated by the current-voltage characteristic shown in FIG. 3. It will be realized that the effect of the diode is realized as a consequence of biasing the VMOS in the conducting state with a polarity opposite to that normally used. It will be noted that during normal operation (a current flow of approximately 20–100 milliamps), current will flow through the FET channel, producing the linear characteristic, and the diode characteristic shown by the dashed line will not be affected. When a current surge appears, however, a sufficiently high voltage is generated across the channel (greater than approximately 0.7 volts) to forward bias the diode into conduction. At this point, the diode will conduct almost all excess current producing the vertical characteristics at the end of the curve. The FET is thus protected from burning out.

In a typical telephone apparatus, the voltage at the inputs 10 and 11 will be approximately 48 volts DC plus some signaling voltage. The current is typically approximately 20–100 milliamps during normal operation. Current surges of up to 25 amps may be generated.

Although the circuit of the present invention has been described for use in telephone systems where a DC potential is applied at the input, it should be realized that the invention might also be useful in systems where an AC potential is applied and a DC output of a single polarity is desired. Such a circuit could therefore function as a full wave rectifier with a small voltage drop and low power loss. In such applications the surge protection diodes would not be needed. Thus, the invention is generally directed to a circuit which produces a constant polarity at the output regardless of polarity changes at the input, whether the input is a DC or AC signal.

It should also be realized that although a combination of voltage controlled device and photo-responsive device has been described, the circuit may include as the switching element any device which switches from a high to low impedance in response to light. The term "light controlled switching device" is intended to include such class of devices including the specific combinations disclosed in the illustrative embodiment.

Various additional modifications will become apparent to those skilled in the art. All such variations which basically rely on the teachings through which the invention has advanced the art are properly considered within the spirit and scope of the invention.

We claim:

1. A circuit for maintaining a single polarity output comprising first and second inputs (10 and 11), first and second outputs (12 and 13) and means for producing the same voltage polarity at the output regardless of the voltage polarity at the input, CHARACTERIZED IN THAT said means includes: a first pair of light controlled switching devices (14 and 15) with one device (14) of the pair being coupled between the first input and the first output and the other device (15) coupled between the second output and the second input; a second pair of light controlled switching devices (16 and 17) with one device (16) of the pair being coupled between the second input and the first output and the other device (17) of the pair being coupled between the second output and the first input; at least two light emitting devices (26, 27, 28 and 29) coupled to said inputs so that at least one will emit light when a first polarity is applied and at least one other will emit light when the opposite polarity is applied, each light emitting device being in close proximity to one or more light controlled switching devices of a corresponding pair of said devices so that one pair will be made conductive for the first polarity and the other pair will be made conductive for the opposite polarity.

2. The circuit according to claim 1 wherein the light controlled switching devices each comprise a field effect transistor with at least one photo-responsive device coupled to its gate.

3. The circuit according to claim 1 further comprising a diode (32, 33, 34, 35) coupled in parallel to each switching device and with a higher ON state voltage drop than said switching device, each of said diodes providing protection of said circuit from current surges.

4. The circuit according to claim 2 wherein the field effect transistors are VMOS devices.

5. The circuit according to claim 2 wherein the field effect transistors have a forward voltage drop less than 0.5 volts at normal operating current.

6. The circuit according to claim 2 wherein coupled to the gate electrode of each field effect transistor is an array of photodiodes coupled in series between the drain and gate.

7. A circuit for maintaining a single polarity output comprising first and second inputs (10 and 11), first and second outputs (12 and 13) and means for producing the same voltage polarity at the output regardless of the voltage polarity at the input, CHARACTERIZED IN THAT said means includes: a first pair of field effect transistors (14 and 15) with one transistor (14) of the pair having its source and drain coupled between the first input and the first output and the other transistor (15) having its source and drain coupled between the second output and the second input; a second pair of field effect transistors (16 and 17) with one transistor (16) of the pair having its source and drain coupled between the second input and the first output and the other transistor (17) of the pair having its source and drain coupled between the second output and the first input; at least one photo-responsive device (26', 27', 28', 29') coupled to the gate electrode of each of the field effect transistors; at least two light emitting devices (26, 27, 28 and 29) coupled to said inputs so that at least one will emit light when a first polarity is applied and at least one other will emit light when the opposite polarity is applied, each light emitting device being in close proximity to one or more photo-responsive devices of a corresponding pair of field effect transistors so that one pair will be made conductive for the first polarity and the other pair will be made conductive for the opposite polarity.

8. A circuit for maintaining a single polarity output comprising first and second inputs (10 and 11), first and second outputs (12 and 13), a first pair of diodes (32 and 33) coupled so as to permit conduction of current between the inputs and outputs when a first polarity of voltage is applied to the inputs, and a second pair of diodes (34 and 35) coupled so as to permit conduction of current between inputs and outputs when the opposite polarity is applied at the inputs, CHARACTERIZED IN THAT the circuit further comprises: a first and second pair of field effect transistors (14, 15 and 16, 17) having a lower ON state voltage drop than the diodes, each transistor of the pair coupled in parallel to a corresponding one of said pair of diodes and each having their gate electrode coupled to at least one photoresponsive device (26', 27', 28' and 29'); and at least two light emitting devices (26, 27, 28 and 29) coupled to said inputs so that at least one will emit light when the first polarity is applied and at least one other will emit light when the opposite polarity is applied, each light emitting device being in close proximity to one or more photo-responsive devices of a corresponding pair of field effect transistors so that one pair will be conductive for the first polarity and the other pair will be conductive for the opposite polarity, the said field effect transistors providing the conduction of normal operating current and the diodes providing conduction of excess current in the event of a current surge.

* * * * *